US012677550B2

(12) United States Patent
Jang et al.

(10) Patent No.: US 12,677,550 B2
(45) Date of Patent: Jul. 7, 2026

(54) DISPLAY DEVICE INCLUDING STRETCHABLE LOWER SUBSTRATE

(71) Applicant: LG Display Co., Ltd., Seoul (KR)

(72) Inventors: HyeongWook Jang, Goyang-si (KR); Insu Hwang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 694 days.

(21) Appl. No.: 18/059,281

(22) Filed: Nov. 28, 2022

(65) Prior Publication Data
US 2023/0209935 A1     Jun. 29, 2023

(30) Foreign Application Priority Data

Dec. 29, 2021    (KR) ........................ 10-2021-0191214

(51) Int. Cl.
| | |
|---|---|
| *H10K 59/13* | (2023.01) |
| *H10K 50/844* | (2023.01) |
| *H10K 59/122* | (2023.01) |
| *H10K 59/131* | (2023.01) |
| *H10K 50/15* | (2023.01) |
| *H10K 50/16* | (2023.01) |
| *H10K 50/17* | (2023.01) |
| (Continued) | |

(52) U.S. Cl.
CPC ......... *H10K 59/131* (2023.02); *H10K 50/844* (2023.02); *H10K 59/122* (2023.02); *H10K 50/15* (2023.02); *H10K 50/16* (2023.02); *H10K 50/17* (2023.02); *H10K 50/171* (2023.02);
(Continued)

(58) Field of Classification Search
CPC .... H10K 59/131; H10K 59/122; H10K 59/00; H10K 59/124; H10K 59/12; H10K 50/844; H10K 50/8445; H10K 50/841; H10K 50/15; H10K 50/16; H10K 50/17;
(Continued)

(56) References Cited

U.S. PATENT DOCUMENTS

| | | | | |
|---|---|---|---|---|
| 10,964,234 | B2 * | 3/2021 | Kim ........................ | G09F 9/301 |
| 11,270,607 | B2 * | 3/2022 | Jung ....................... | G06F 3/044 |

(Continued)

FOREIGN PATENT DOCUMENTS

| | | | | |
|---|---|---|---|---|
| EP | 3675178 A1 * | 7/2020 | ........... | H10K 59/121 |

*Primary Examiner* — Ida M Soward
(74) *Attorney, Agent, or Firm* — Seed Intellectual Property Law Group LLP

(57) ABSTRACT

A display device according to an example embodiment of the present disclosure may include a stretchable lower substrate; a pattern layer disposed on the lower substrate and including a plurality of plate patterns and a plurality of line patterns; a plurality of connection lines disposed on each of the plurality of line patterns to connect the plurality of plate patterns adjacent to each other; an insulating layer disposed on each of the plurality of plate patterns; a plurality of light emitting elements disposed on the insulating layer and each including an anode, an organic light emitting layer and a cathode; a bank disposed on edge of the anode; and an encapsulation structure disposed on the bank and the cathode, wherein each of the plurality of plate patterns includes a first area in which the plurality of light emitting elements are disposed; a second area which surrounds the first area and in which a first protrusion pattern having an undercut shape is disposed, a third area surrounding the second area; and a fourth area which surrounds the third area and in which a second protrusion pattern having an undercut shape is disposed.

14 Claims, 6 Drawing Sheets

(51) Int. Cl.
    *H10K 50/80*      (2023.01)
    *H10K 50/842*    (2023.01)
    *H10K 59/12*     (2023.01)

(52) U.S. Cl.
    CPC ....... *H10K 50/8426* (2023.02); *H10K 50/868*
              (2023.02); *H10K 59/12* (2023.02)

(58) Field of Classification Search
    CPC ............. H10K 50/171; H10K 50/8426; H10K
                   50/868; H10K 77/111
    See application file for complete search history.

(56)             References Cited

U.S. PATENT DOCUMENTS

| | | | |
|---|---|---|---|
| 2016/0198567 A1* | 7/2016 | Hong ................... | G06F 3/0412 |
| | | | 362/418 |
| 2018/0090699 A1* | 3/2018 | Shin .................... | H10K 59/353 |
| 2019/0207131 A1* | 7/2019 | Lu ........................ | H10K 59/122 |
| 2020/0027945 A1* | 1/2020 | Kim ..................... | H10H 29/142 |
| 2020/0144522 A1* | 5/2020 | Jung .................... | H10K 59/131 |
| 2020/0212117 A1* | 7/2020 | Jeon ..................... | H10W 90/00 |
| 2021/0027671 A1* | 1/2021 | Lee ......................... | G09F 9/301 |
| 2021/0028155 A1* | 1/2021 | Kim ..................... | H10W 90/00 |
| 2021/0056873 A1* | 2/2021 | Jung ....................... | G09F 9/301 |
| 2021/0066266 A1* | 3/2021 | Jung .................... | H10W 90/00 |
| 2021/0083212 A1* | 3/2021 | Jung .................... | H10K 59/131 |
| 2021/0111167 A1* | 4/2021 | Kang ................... | H10W 90/00 |
| 2021/0126082 A1* | 4/2021 | Yoon ................... | H10K 50/856 |
| 2021/0134772 A1* | 5/2021 | Jung .................... | H10W 90/00 |
| 2021/0183277 A1* | 6/2021 | Kim ..................... | G06F 1/1626 |
| 2021/0234135 A1* | 7/2021 | Kim .................. | H10K 59/8791 |

* cited by examiner

DISPLAY DEVICE INCLUDING STRETCHABLE LOWER SUBSTRATE

CROSS-REFERENCE TO RELATED APPLICATIONS

This application claims the benefit of and priority to Korean Patent Application No. 10-2021-0191214, filed on Dec. 29, 2021, in the Republic of Korea, which is herein incorporated by reference in its entirety.

BACKGROUND

Technical Field

The present disclosure relates to a display device, and more particularly, to a display device in which crack propagation is suppressed.

Description of the Related Art

Display devices used for a computer monitor, a TV, a mobile phone, and the like include an organic light emitting display (OLED) that emits light by itself, a liquid-crystal display (LCD) that requires a separate light source, and the like.

Such display devices are being applied to more and more various fields including not only a computer monitor and a TV, but personal mobile devices, and thus, display devices having a reduced volume and weight while having a wide active area are being studied.

Recently, a stretchable display device manufactured to be stretchable in a specific direction and changeable into various shapes by forming a display unit, lines, and the like on a flexible substrate such as plastic that is a flexible material has received considerable attention as a next-generation display device.

BRIEF SUMMARY

A technical benefit of the present disclosure is to provide a display device allowing for minimization of damage to a light emitting element due to crack propagation by disposing a plurality of protrusion patterns on edges of each of a plurality of plate patterns in which a plurality of sub-pixels are defined.

Another technical benefit of the present disclosure is to provide a display device allowing for entire surface depositing of an inorganic encapsulation layer.

Another technical benefit of the present disclosure is to provide a display device allowing for an improvement in moisture permeation prevention performance of an encapsulation unit.

Another technical benefit of the present disclosure is to provide a display device capable of preventing damage to a connection line due to a step thereof by disposing the connection line in a flat shape without the step on a lower substrate.

Objects of the present disclosure are not limited to the above-mentioned objects, and other objects, which are not mentioned above, can be clearly understood by those skilled in the art from the following descriptions.

A display device according to an example embodiment of the present disclosure may include a stretchable lower substrate; a pattern layer disposed on the lower substrate and including a plurality of plate patterns and a plurality of line patterns; a plurality of connection lines disposed on each of the plurality of line patterns to connect the plurality of plate patterns adjacent to each other; an insulating layer disposed on each of the plurality of plate patterns; a plurality of light emitting elements disposed on the insulating layer and each including an anode, an organic light emitting layer and a cathode; a bank disposed on edge of the anode; and an encapsulation unit (or encapsulation structure) disposed on the bank and the cathode, wherein each of the plurality of plate patterns includes a first area in which the plurality of light emitting elements are disposed; a second area which surrounds the first area and in which a first protrusion pattern having an undercut shape is disposed, a third area surrounding the second area; and a fourth area which surrounds the third area and in which a second protrusion pattern having an undercut shape is disposed.

Other detailed matters of the example embodiments are included in the detailed description and the drawings.

According to the present disclosure, a connection line is formed to have a flat shape under a plate pattern, so that damage to the connection line due to occurrence of a step in the connection line can be minimized.

According to the present disclosure, by disposing a protrusion pattern on an edge of a plate pattern, it is possible to suppress propagation of cracks through an organic light emitting layer and an encapsulation unit when the display device is stretched.

According to the present disclosure, it is possible to provide a display device allowing for disconnecting an inorganic encapsulation layer and entire surface depositing of the inorganic encapsulation layer by disconnection of an inorganic encapsulation layer.

According to the present disclosure, it is possible to improve moisture permeation prevention performance by forming a step in an encapsulation unit at an edge of a plate pattern.

The effects according to the present disclosure are not limited to the contents exemplified above, and more various effects are included in the present specification.

DETAILED DESCRIPTION

Figure 1:
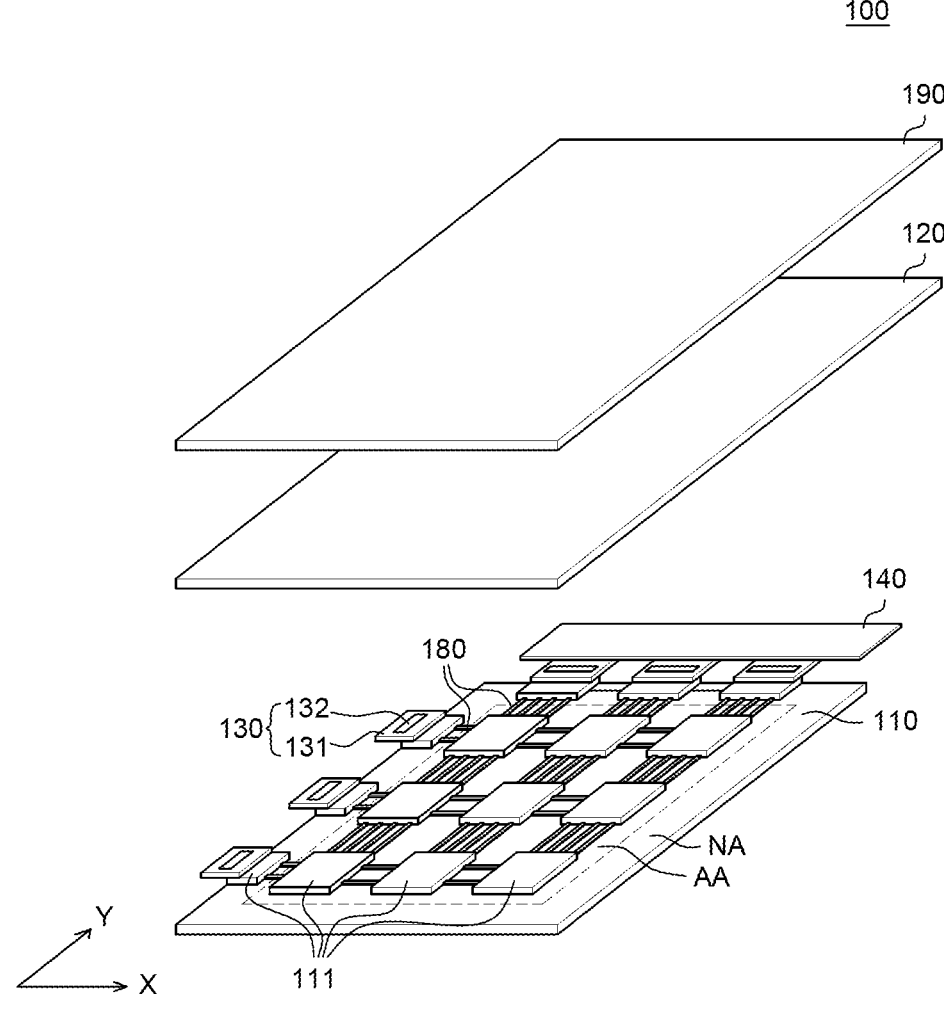
FIG. 1 is an exploded perspective view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

FIG. 1 is an exploded perspective view of a display device according to an example embodiment of the present disclosure. Referring to FIG. 1, a display device 100 includes a lower substrate 110, a plurality of plate patterns 111, connection lines 180, COFs (chips on film) 130, a printed circuit board 140, an upper substrate 120, and a polarization layer 190. In FIG. 1, an illustration of an adhesive layer for bonding the lower substrate 110 and the upper substrate 120 is omitted for convenience of explanation.

The lower substrate 110 is a substrate for supporting and protecting various components of the display device 100. The lower substrate 110 is a stretchable substrate and may be formed of an insulating material that can be bent or stretched. For example, the lower substrate 110 may be formed of silicone rubber such as polydimethylsiloxane (PDMS) or an elastomer such as polyurethane (PU) and the like and thus, may have flexible properties. However, a material of the lower substrate 110 is not limited thereto.

The lower substrate 110 is a ductile substrate and may be reversibly expandable and contractible. Further, a modulus of elasticity of the lower substrate 110 may be several MPa to several hundreds of MPa, and a ductile breaking rate of the lower substrate 110 may be 100% or higher. A thickness of the lower substrate may be 10 μm to 1 mm, but is not limited thereto.

The lower substrate 110 may be formed of a ductile substrate, and may further include a rigid pattern formed of a material that is more rigid than that of the ductile substrate. That is, the lower substrate 110 may include first and second lower patterns having different moduli. For example, the first lower pattern may have a relatively high modulus compared to the second lower pattern, and the second lower pattern may have a relatively low modulus compared to the first lower pattern. A more detailed description of the lower substrate 110 will be described below with reference to FIG. 3.

The lower substrate 110 may include an active area AA and a non-active area NA surrounding the active area AA.

The active area AA is an area in which an image is displayed in the display device 100 and in the active area AA, a display element and various driving elements for driving the display element are disposed. The active area AA includes a plurality of pixels including a plurality of sub-pixels. The plurality of pixels are disposed in the active area AA and include a plurality of display elements. Each of the plurality of sub-pixels may be connected to various lines. For example, each of the plurality of sub-pixels may be connected to various lines such as a gate line, a data line, a high potential power line, a low potential power line, and a reference voltage line.

The non-active area NA is an area adjacent to the active area AA. The non-active area NA is an area which is adjacent to the active area AA and surrounds the active area AA. The non-active area NA is an area in which an image is not displayed, and lines and circuits and the like may be formed therein. For example, a plurality of pads may be disposed in the non-active area NA, and each of the pads may be connected to each of the plurality of sub-pixels in the active area AA.

The plurality of plate patterns 111 are disposed on areas overlapping the first lower patterns of the lower substrate 110. The plurality of plate patterns 111 are rigid patterns and are disposed to be spaced apart from each other. The plurality of plate patterns 111 may be more rigid than the second lower pattern of the lower substrate 110.

The plurality of plate patterns 111 which are a plurality of rigid patterns may be formed of a plastic material having flexibility, for example, polyimide (PI), polyacrylate, polyacetate or the like.

A modulus of the plurality of plate patterns 111 may be higher than that of the second lower pattern of the lower substrate 110. The modulus is an elastic modulus indicating a ratio of deformation by stress to stress applied to the substrate. When the modulus is relatively high, hardness may be relatively high. Accordingly, the plurality of plate patterns 111 may be a plurality of rigid patterns having rigidity compared to the lower substrate 110. The modulus of the plurality of plate patterns 111 may be 1000 times greater than a modulus of the lower substrate 110, but the present disclosure is not limited thereto.

The connection lines 180 are disposed below the plurality of plate patterns 111 and on the lower substrate 110. That is, the connection lines 180 may be disposed between the plurality of plate patterns 111 and the lower substrate 110. The connection lines 180 may be electrically connected to the display elements through contact holes formed in the insulating layers under the display elements that are disposed on the plurality of plate patterns 111. A more detailed description of the connection lines 180 will be described in detail with reference to FIGS. 2 and 3.

The COF 130 is a film in which various components are disposed on a base film 131 formed of a flexibility material, and is a component for supplying signals to the plurality of sub-pixels of the active area AA. The COF 130 may be bonded to the plurality of pads disposed in the non-active area NA, and supplies a power voltage, a data voltage, a gate voltage, and the like to each of the plurality of sub-pixels in the active area AA through the pads. The COF 130 includes the base film 131 and a driver IC 132, and besides this, various components may be disposed therein.

The base film 131 is a layer that supports the driver IC 132 of the COF 130. The base film 131 may be formed of an insulating material, for example, may be formed of an insulating material having flexibility.

The driver IC 132 is a component that processes data for displaying an image and a driving signal for processing the data. In FIG. 1, the driver IC 132 is illustrated as being mounted in a manner of the COF 130, but is limited thereto and the driver IC 132 may be mounted in a chip on glass (COG), a tape carrier package (TCP) manner, or the like.

A control unit (or control circuit) such as an IC chip, a circuit or the like may be mounted on the printed circuit board 140. Also, a memory, a processor, and the like may be mounted on the printed circuit board 140. The printed circuit board 140 is a component to transmit a signal for driving the display element from the controller to the display element.

The printed circuit board 140 may be connected to the COFs 130 and electrically connected to each of the plurality of sub-pixels of the plurality of plate patterns 111.

The upper substrate 120 is a substrate that overlaps the lower substrate 110 to protect various components of the display device 100. The upper substrate 120 is a ductile substrate and may be formed of an insulating material that can be bent or stretched. For example, the upper substrate 120 may be formed of a flexible material, and may be formed of the same material as the lower substrate 110, but is not limited thereto.

The polarization layer 190 is a component that suppresses external light reflection of the display device 100, and may be disposed on the upper substrate 120 to overlap the upper substrate 120. However, the present disclosure is not limited thereto, and the polarization layer 190 may be disposed under the upper substrate 120 or may be omitted depending on a configuration of the display device 100.

Figure 2:
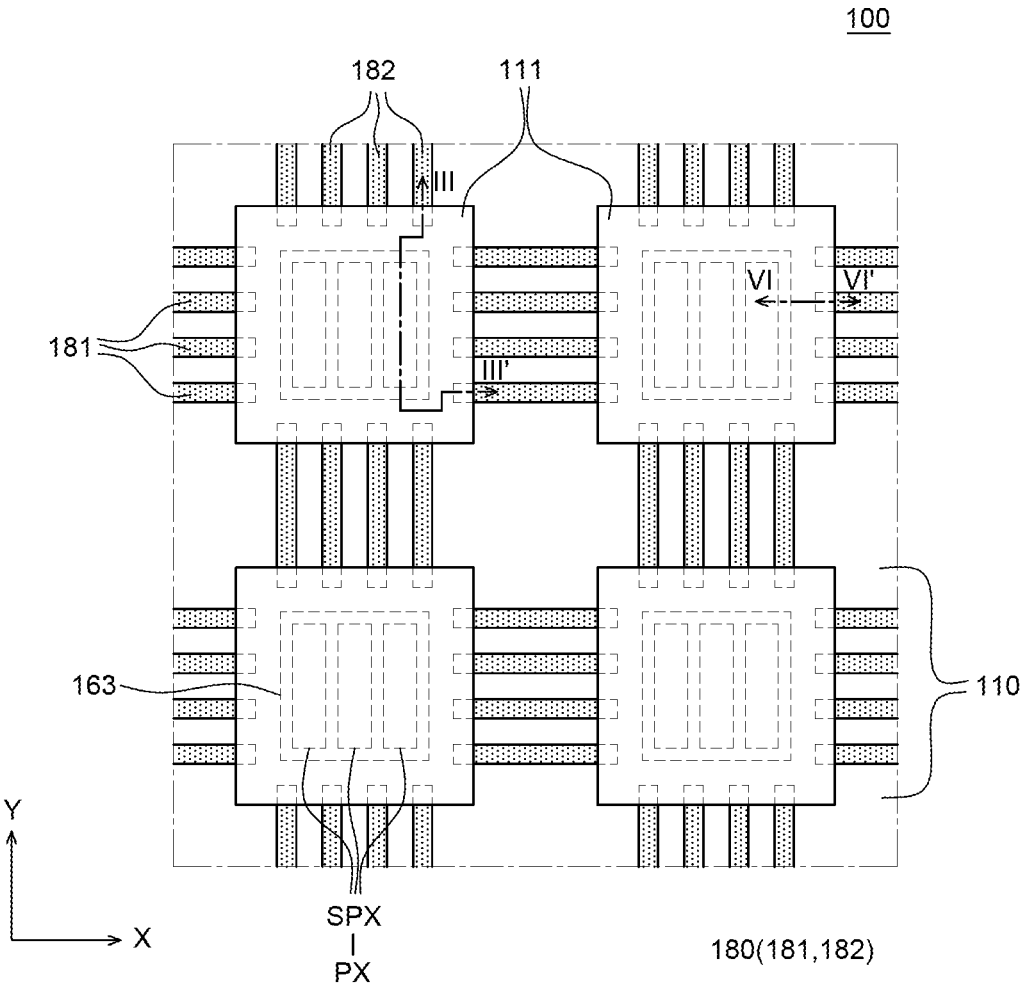
FIG. 2 is an enlarged plan view of the display device according to an example embodiment of the present disclosure.
Figure 3:
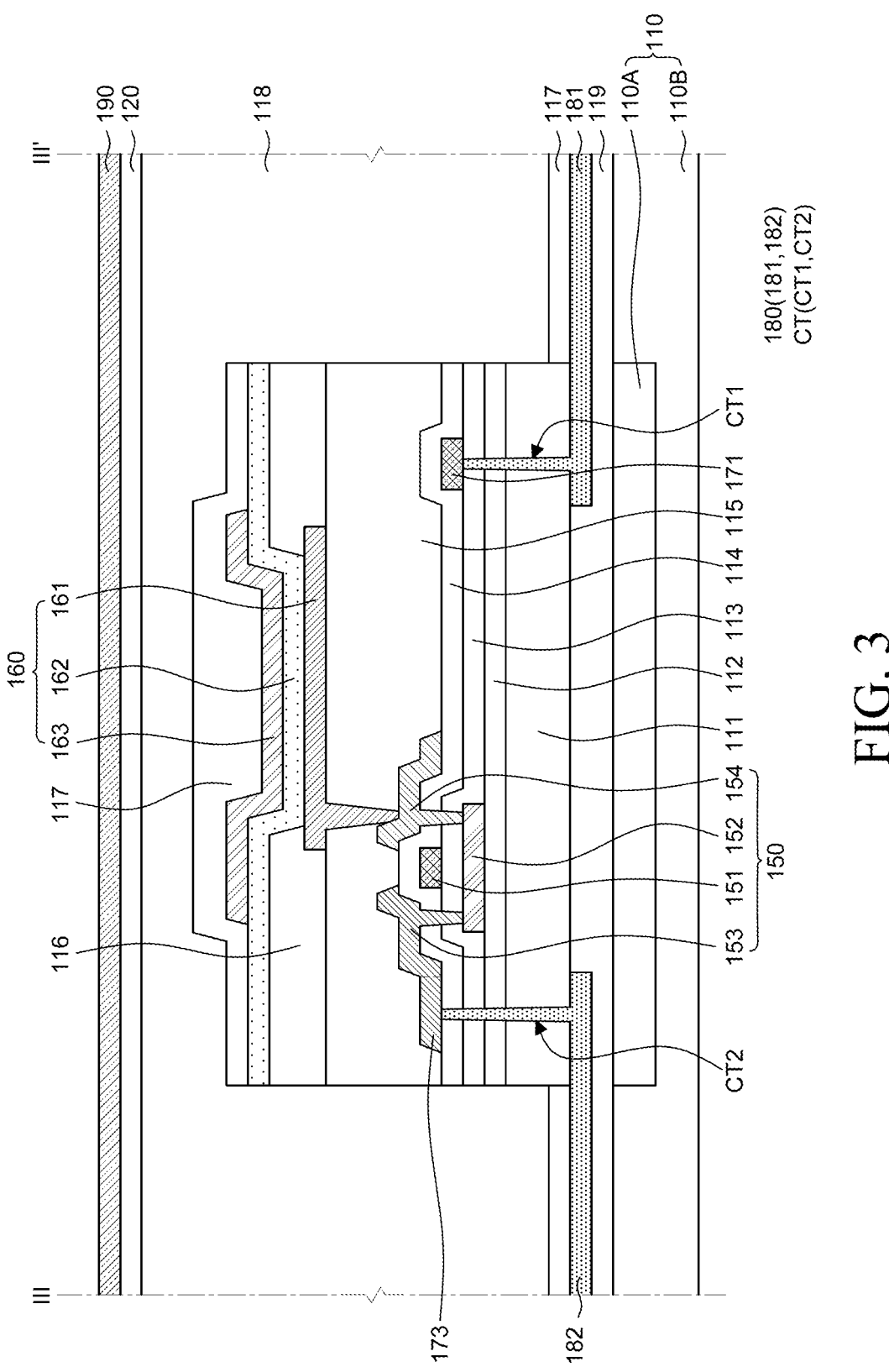
FIG. 3 is a cross-sectional view taken along line III-III' of FIG. 2.

Hereinafter, FIGS. 2 to 3 are referred together for a more detailed description of the display device 100 according to an example embodiment of the present disclosure.

FIG. 3 is a cross-sectional view taken along line III-III' of FIG. 2. FIG. 3 is a schematic cross-sectional view of one sub-pixel of FIG. 1. For convenience of explanation, it will be described with reference to FIG. 1.

Referring to FIGS. 2 and 3, the lower substrate 110 that supports components of the display device 100 is disposed. More specifically, referring to FIG. 3, the lower substrate 110 includes a plurality of first lower patterns 110A and a second lower pattern 110B.

The plurality of first lower patterns 110A are disposed in areas overlapping the plurality of plate patterns 111 of the lower substrate 110. The plurality of first lower patterns 110A may be disposed under the plurality of plate patterns 111, so that upper surfaces thereof may be bonded to lower surfaces of the plurality of plate patterns 111 by a lower adhesive layer 119.

In addition, the second lower pattern 110B is disposed in an area of the lower substrate 110 excluding the plurality of first lower patterns 110A. The second lower pattern 110B may be disposed to surround side surfaces and lower surfaces of the plurality of first lower patterns 110A. However, the present disclosure is not limited thereto, and the second lower pattern 110B may be configured to be disposed on the same plane as the first lower patterns 110A. In addition, the second lower pattern 110B may be disposed under the connection lines 180 and the lower adhesive layer 119, so that an upper surface thereof may be in contact with a lower surface of the lower adhesive layer 119.

In this case, a modulus of the plurality of first lower patterns 110A may be greater than a modulus of the second lower pattern 110B. Accordingly, the plurality of first lower patterns 110A may be a plurality of rigid lower patterns having rigidity compared to the second lower pattern 110B. The second lower pattern 110B may be a ductile lower pattern having ductility compared to the plurality of first lower patterns 110A. The modulus of the plurality of first lower patterns 110A may be 1000 times greater than the modulus of the second lower pattern 110B, but the present disclosure is not limited thereto.

The plurality of first lower patterns 110A may be formed of the same material as the plurality of plate patterns 111 and may be formed of a plastic material having flexibility, for example, may be formed of polyimide (PI), polyacrylate, polyacetate, or the like. However, the present disclosure is not limited thereto, and the plurality of first lower patterns 110A may be formed of a material having a modulus that is equal to or less than the modulus of the plurality of plate patterns 111.

And, the second lower pattern 110B is a ductile lower pattern and may be reversibly expandable and contractible, may have an elastic modulus of several MPa to several hundred MPa, and may have a ductile breaking rate of 100% or higher. Accordingly, the second lower pattern 110B may be formed of an insulating material that can be bent or stretched, and the second lower pattern 110B may be formed of silicon rubber such as polydimethylsiloxane (PDMS) or an elastomer such as polyurethane (PU) and the like, but is not limited thereto.

Referring to FIGS. 2 and 3, the plurality of plate patterns 111 are disposed on the lower substrate 110. The plurality of plate patterns 111 are disposed in areas overlapping the first lower patterns 110A of the lower substrate 110. The plurality of plate patterns 111 are spaced apart from each other and disposed on the lower substrate 110. In this case, a separation distance between the plurality of plate patterns 111 and a separation distance between the plurality of first lower patterns 110A of the lower substrate 110 may be identical to each other. In this manner, the plurality of plate patterns 111 are disposed to be spaced apart from each other by a predetermined distance, so that the plurality of plate patterns 111 may be disposed in a matrix form on the lower substrate 110 as illustrated in FIGS. 1 and 2, but are not limited thereto.

In the plurality of plate patterns 111, contact holes CT for electrically connecting the connection lines 180 that are disposed under the plurality of plate patterns 111 and gate pads 171 and data pads 173 that are disposed on the plurality of plate patterns 111 may be formed.

Referring to FIG. 3, a buffer layer 112 is disposed on the plurality of plate patterns 111. The buffer layer 112 is formed on the plurality of plate patterns 111 to protect various components of the display device 100 from penetration of moisture ($H_2O$) and oxygen ($O_2$) from the outside of the lower substrate 110 and the plurality of plate patterns 111. The buffer layer 112 may be formed of an insulating material, and may be composed of a single layer or multiple layers of an inorganic layer that is formed of, for example, silicon nitride (SiN$_X$), silicon oxide (SiO$_X$), silicon oxynitride (SiON) or the like. However, the buffer layer 112 may be omitted depending on a structure or characteristics of the display device 100.

In this case, the buffer layer 112 may be formed only in the areas overlapping the plurality of plate patterns 111. As described above, since the buffer layer 112 may be formed of an inorganic material, the buffer layer 112 may be damaged, such as easily cracked, while the display device 100 is stretched. Accordingly, the buffer layer 112 may not be formed in an area between the plurality of plate patterns 111, but may be patterned in shapes of the plurality of plate patterns 111 and formed only over the plurality of plate patterns 111. Accordingly, in the display device 100 according to an example embodiment of the present disclosure, the buffer layer 112 is formed only in areas overlapping the plurality of plate patterns 111 which are rigid patterns, so that damage to the buffer layer 112 may be prevented even when the display device 100 is deformed, such as bent or stretched.

In the buffer layer 112, contact holes CT for electrically connecting the connection lines 180 that are disposed under the plurality of plate patterns 111 and the gate pads 171 and data pads 173 that are disposed on the plurality of plate patterns 111 may be formed. The contact holes CT that are formed in the buffer layer 112 may extend from the contact holes CT formed in the plurality of plate patterns 111.

Referring to FIG. 3, a transistor 150 including a gate electrode 151, an active layer 152, a source electrode 153, and a drain electrode 154 is formed on the buffer layer 112. For example, the active layer 152 is formed on the buffer layer 112, and a gate insulating layer 113 for insulating the active layer 152 and the gate electrode 151 is formed on the active layer 152. An interlayer insulating layer 114 for insulating the gate electrode 151, and the source electrode 153 and the drain electrode 154 is formed. The source electrode 153 and the drain electrode 154 that are respectively in contact with the active layer 152 are formed on the interlayer insulating layer 114.

In addition, the gate insulating layer 113 and the interlayer insulating layer 114 may be patterned and formed only in areas overlapping the plurality of plate patterns 111. The gate insulating layer 113 and the interlayer insulating layer 114 may also be formed of an inorganic material in the same manner as the buffer layer 112. Thus, in a process of stretching the display device 100, damage may be easily generated such as the occurrence of cracks. Accordingly, the gate insulating layer 113 and the interlayer insulating layer 114 are not formed in the area between the plurality of plate patterns 111, but may be patterned in the shapes of the plurality of plate patterns 111 and formed only on upper portions of the plurality of plate patterns 111.

In addition, in the gate insulating layer 113 and the interlayer insulating layer 114, contact holes CT for electrically connecting the connection lines 180 that are disposed under the plurality of plate patterns 111 and the gate pads 171 and the data pads 173 may be formed. The contact holes CT formed in the gate insulating layer 113 and the interlayer insulating layer 114 may extend to the contact holes CT formed in the plurality of plate patterns 111 and the buffer layer 112.

FIG. 3 illustrates a driving transistor among various transistors that may be included in the display device 100 for convenience of explanation, but a switching transistor, a capacitor and the like may also be included in the display device. In addition, although it has been described herein that the transistor 150 has a coplanar structure, various transistors such as having a staggered structure or the like may also be used.

Referring to FIG. 3, the gate pad 171 is disposed on the gate insulating layer 113. The gate pad 171 is a pad for transmitting a gate signal to a plurality of sub-pixels SPX. The gate pad 171 is positioned on the same layer as the gate electrode 151 and may be formed of the same material as the gate electrode 151, but is not limited thereto. That is, the gate pad 171 may be formed of the same material as at least one of a conductive patterns forming an organic light emitting element 160 and the transistor 150. For example, the gate pad 171 may be formed of the same material as and formed on the same layer as one of the gate electrode 151, the source electrode 153, the drain electrode 154, an anode 161 and the like, or may be formed of the same material as and formed on the same layer as two of the gate electrode 151, the source electrode 153, the drain electrode 154, the anode 161 and the like. The gate pad 171 may be electrically connected to a first connection line 181 serving as a gate line that is disposed under the plate pattern 111 by a first contact hole CT1 that is formed in the plate pattern 111, the buffer layer 112, and the gate insulating layer 113.

Referring to FIG. 3, the data pad 173 is disposed on the interlayer insulating layer 114. The data pad 173 may be electrically connected to a second connection line 182 serving as a data line, and may transmit a data signal that is transmitted from the second connection line 182 to the plurality of sub-pixels SPX. The data pad 173 may be defined as an area in which the source electrode 153 of the transistor 150 extends, but is not limited thereto. That is, the data pad 173 may be formed of the same material as at least one of the conductive patterns forming the organic light emitting element 160 and the transistor 150. For example, the data pad 173 may be formed of the same material as and formed on the same layer as one of the gate electrode 151, the source electrode 153, the drain electrode 154, the anode 161, and the like, or may be formed of the same material as and formed on the same layer as two of the gate electrode 151, the source electrode 153, the drain electrode 154, the anode 161 and the like. The data pad 173 may be electrically connected to the second connection line 182 serving as a gate line that is disposed under the plate pattern 111 by a second contact hole CT2 that is formed in the plate pattern 111, the buffer layer 112, the gate insulating layer 113, and the interlayer insulating layer 114.

Referring to FIG. 3, a planarization layer 115 is formed on the transistor 150 and the interlayer insulating layer 114. The planarization layer 115 planarizes an upper portion of the transistor 150. The planarization layer 115 may be composed of a single layer or a plurality of layers, and may be formed of an organic material. For example, the planarization layer 115 may be formed of an acryl-based organic material, but is not limited thereto. The planarization layer 115 may include a contact hole for electrically connecting the transistor 150 and the anode 161. Although the planarization layer 115 is illustrated as a continuous layer on one plate pattern 111 in FIG. 3, this is to schematically explain a positional relationship between a bank 116 and the transistor 150, and a more detailed description thereof will be provided later in FIG. 4.

In some embodiments, a passivation layer may be formed between the transistor 150 and the planarization layer 115. That is, in order to protect the transistor 150 from penetration of moisture and oxygen and the like, a passivation layer covering the transistor 150 may be formed. The passivation layer may be formed of an inorganic material, and may be formed of a single layer or multilayers, but is not limited thereto.

Referring to FIG. 3, the organic light emitting element 160 is disposed on the planarization layer 115. The organic light emitting element 160 is a component that is disposed to correspond to each of the plurality of sub-pixels SPX and emits light having a specific wavelength band. That is, the organic light emitting element 160 may be a blue organic light emitting element that emits blue light, a red organic light emitting element that emits red light, a green organic light emitting element that emits green light, or a white organic light emitting element that emits white light, but is not limited thereto. When the organic light emitting element 160 is a white organic light emitting element, the display device 100 may further include a color filter. The organic light emitting element 160 includes the anode 161, an organic light emitting layer 162, and a cathode 163.

Specifically, the anode 161 is disposed on the planarization layer 115. The anode 161 is an electrode that is configured to supply holes to the organic light emitting layer 162. The anode 161 may be formed of a transparent conductive material having a high work function. Here, the transparent conductive material may include indium tin oxide (ITO), indium zinc oxide (IZO), and indium tin zinc oxide (ITZO). In this case, when the display device 100 is implemented as a top emission type, the anode 161 may further include a reflector. The anode 161 is disposed to be spaced apart for each sub-pixel SPX and is electrically connected to the transistor 150 through a contact hole of the planarization layer 115. For example, although it is illustrated in FIG. 3 that the anode 161 is electrically connected to the drain electrode 154 of the transistor 150, it may be electrically connected to the source electrode 153.

The bank 116 is formed on an edge of the anode 161 and the planarization layer 115. The bank 116 is a component that separates the sub-pixels SPX adjacent to each other. The bank 116 is disposed to cover at least a portion of both sides of the anode 161 adjacent thereto and exposes a portion of an upper surface of the anode 161. The bank 116 may serve to prevent a defect, in which light is emitted in a lateral direction of the anode 161 due to current concentration at the edge of the anode 161, so that an unintended sub-pixel SPX emits light or color mixing occurs. The bank 116 may be formed of an acryl-based resin, a benzocyclobutene (BCB)-based resin, or polyimide, but is not limited thereto. A more detailed description of the bank 116 will be provided later with reference to FIG. 4.

The organic light emitting layer 162 is disposed on the anode 161 and the bank 116. The organic light emitting layer 162 is configured to emit light. The organic light emitting layer 162 may include a light emitting material, and the light emitting material may include a phosphorescent material or a fluorescent material, but is not limited thereto.

The organic light emitting layer 162 may be configured as one light emitting layer. Alternatively, the organic light emitting layer 162 may be stacked with a charge generating layer interposed therebetween and have a stack structure in which a plurality of light emitting layers are stacked. In addition, the organic light emitting layer 162 may further include at least one organic layer among a hole transport layer, an electron transport layer, a hole blocking layer, an electron blocking layer, a hole injection layer, and an electron injection layer. Although the organic light emitting layer 162 is illustrated as one continuous layer in FIG. 3, this is to schematically explain a positional relationship between the bank 116 and an encapsulation unit 117, and a more detailed description will be provided later in FIG. 4.

Referring to FIGS. 2 and 3, the cathode 163 is disposed on the organic light emitting layer 162. The cathode 163 supplies electrons to the organic light emitting layer 162. The cathode 163 may be formed of a transparent conductive oxide such as indium tin oxide (ITO), indium tin zinc oxide (ITZO), zinc oxide (ZnO), and tin oxide (TO), or an alloy of ytterbium (Yb). Alternatively, the cathode 163 may be formed of a metallic material.

The cathode 163 may be patterned and formed to overlap each of the plurality of plate patterns 111. That is, the cathode 163 may be formed only in areas overlapping the plurality of plate patterns 111, and may not be formed in an area between the plurality of plate patterns 111. The cathode 163 is formed of a material such as a transparent conductive oxide or a metallic material. Thus, when the cathode 163 is also formed in the area between the plurality of plate patterns 111, the cathode 163 may be damaged in the process of stretching the display device 100. Accordingly, the cathode 163 may be formed to correspond to each of the plurality of plate patterns 111 on a plane. Referring to FIGS. 2 and 3, the cathode 163 may be formed to have an area that does not overlap an area where the connection lines 180 are disposed in the areas overlapping the plurality of plate patterns 111.

Referring to FIGS. 2 and 3, the encapsulation unit 117 is disposed on the organic light emitting element 160. The encapsulation unit 117 may cover the organic light emitting element 160 and may come in contact with a portion of an upper surface of the bank 116 to thereby seal the organic light emitting element 160. Accordingly, the encapsulation unit 117 protects the organic light emitting element 160 from moisture, air, or physical impacts that may penetrate from the outside.

The encapsulation unit 117 overlaps the plurality of plate patterns 111 and is disposed over the cathode. In addition, the encapsulation unit 117 is also disposed over a plurality of the connection lines 180. That is, the encapsulation unit 117 may be disposed to overlap an entire surface of the lower substrate 110.

Since the encapsulation unit 117 may be configured to include an inorganic layer, damage may be easily generated such as the occurrence of cracks in the process of stretching the display device 100. In particular, since the organic light emitting element 160 is vulnerable to moisture or oxygen, when the encapsulation unit 117 is damaged, reliability of the organic light emitting element 160 may decrease. Accordingly, in the display device 100 according to an example embodiment of the present disclosure, the encapsulation unit 117 may be formed to be disconnected at edges of the plurality of plate patterns 111. Even when the display device 100 is deformed, such as bent or stretched, damage to the organic light emitting layer 162 due to cracks in the encapsulation unit 117 may be minimized.

Compared to a conventional, typical flexible organic light emitting display device, the display device 100 according to an example embodiment of the present disclosure has a difference in terms of having a structure in which the plurality of plate patterns 111 having relatively rigidity are spaced apart from each other and are disposed on the lower substrate 110 having relatively ductility. In addition, the cathode 163 and the encapsulation unit 117 of the display device 100 are patterned to correspond to each of the plurality of plate patterns 111. That is, the display device 100 according to an example embodiment of the present disclosure has a structure in which the display device 100 can be more easily deformed when a user stretches or bends the display device 100, and may have a structure capable of minimizing damage to components of the display device 100 in a process in which the display device 100 is deformed.

In the display device 100 according to an example embodiment of the present disclosure, the lower substrate 110 includes the plurality of first lower patterns 110A overlapping the plurality of plate patterns 111 and the second lower pattern 110B not overlapping the plurality of plate patterns 111. The modulus of the plurality of first lower patterns 110A is greater than the modulus of the second lower pattern 110B. When the display device 100 is deformed, such as bent or stretched, the plurality of first lower patterns 110A disposed under the plurality of plate patterns 111 that are rigid patterns are rigid lower patterns and may support the plurality of plate patterns 111. Accordingly, various elements disposed on the plurality of plate patterns 111 may be supported by the plurality of first lower patterns 110A together with the plurality of plate patterns 111, and may allow for a reduction in damage thereto as the display device 100 is deformed.

In addition, when the display device 100 is deformed such as bent or stretched, the plurality of first lower patterns 110A are formed of the same material as the plurality of plate patterns 111 and have a higher modulus than the modulus of the second lower pattern 110B, so that the plurality of first lower patterns 110A may not be deformed such as stretched more than the plurality of plate patterns 111, and bonding between the plurality of first lower patterns 110A and the plurality of plate patterns 111 can be maintained firmly. Accordingly, in the display device 100 according to an example embodiment of the present disclosure, the plurality of first lower patterns 110A and the plurality of plate patterns 111 are disposed to overlap each other, so that areas in which the display elements are disposed have more rigidity. Therefore, even when the display device 100 is continuously deformed, such as bent or stretched, the occurrence of defects in the display device 100 may be reduced.

In addition, the second lower pattern 110B has a ductility characteristic compared to that of the plurality of first lower patterns 110A, so that an area in which the second lower pattern 110B between the plurality of plate patterns 111 is disposed may be bent or stretched freely. Accordingly, the connection line 180 disposed to overlap the second lower pattern 110B may also be bent or stretched more freely. Accordingly, deformation, such as bending or stretching, of the display device 100 according to an example embodiment of the present disclosure can be made more easily.

Referring to FIG. 3, the connection lines 180 are disposed between the plurality of plate patterns 111 and the lower substrate 110. More specifically, the connection lines 180 may be disposed between partial lower areas of the plurality of plate patterns 111 and the lower adhesive layer 119 and between an upper adhesive layer 118 that bonds the lower substrate 110 and the upper substrate 120, and the lower adhesive layer 119 that bonds the second lower pattern 110B and the plurality of plate patterns 111. Also, lower portions of the connection lines 180 may be in contact with the lower adhesive layer 119. A part of an upper portions of the connection lines 180 may be in contact with the encapsulation unit 117 and the remaining part of the upper portions of the connection lines 180 may be in contact with the plurality of plate patterns 111. Since the encapsulation unit 117 is not selectively disposed only on the plurality of plate patterns 111, but is also disposed on areas in which the plurality of plate patterns 111 are not disposed, the encapsulation unit 117 may be disposed on an entire surface of the lower substrate 110. A more detailed description of this will be provided later with reference to FIG. 4.

In addition, the connection lines 180 may be disposed to extend from partial areas of the first lower pattern 110A of the lower substrate 110 to areas of the second lower pattern 110B. In this case, the partial areas of the first lower pattern 110A may correspond to the contact holes CT formed in the plate pattern 111.

The connection lines 180 may be electrically connected to the pads 171 and 173 disposed on each plate pattern 111 through the contact holes CT. For example, the connection lines 180 may be electrically connected to the gate pad 171 and the data pad 173 through the contact holes CT formed in the plate pattern 111 and the insulating layers under the pads 171 and 173.

The connection lines 180 include the first connection lines 181 extending in an X-axis direction among the connection lines 180 and the second connection lines 182 extending in a Y-axis direction among the connection lines 180. The first connection line 181 is electrically connected to the gate pad 171 disposed on each of the plate patterns 111 through the first contact hole CT1, and the second connection line 182 is electrically connected to the data pad 173 disposed on each of the plate patterns 111 through the second contact hole CT2.

Referring to FIG. 2, the first connection lines 181 may connect pads on two plate patterns 111 that are disposed side by side among pads on the plurality of plate patterns 111 adjacent in the X-axis direction. The first connection lines 181 may function as gate lines or low potential power lines, but are not limited thereto. For example, the first connection lines 181 may function as gate lines and may electrically connect the gate pads 171 on two plate patterns 111 that are disposed side by side in the X-axis direction through the first contact holes CT1 formed in the gate insulating layer 113, the buffer layer 112, and the plate patterns 111 that are disposed below the gate pads 171. Accordingly, as described above, the gate pads 171 on the plurality of plate patterns 111 disposed in the X-axis direction may be connected by the first connection lines 181 functioning as gate lines, and one gate signal may be transmitted thereto.

Referring to FIG. 2, the second connection lines 182 may connect pads on two plate patterns 111 that are disposed side by side among pads on the plurality of plate patterns 111 adjacent in the Y-axis direction. The second connection lines 182 may function as data lines, high potential power lines, or reference voltage lines, but are not limited thereto. For example, the second connection lines 182 may function as data lines and may electrically connect the data pads 173 on two plate patterns 111 disposed side by side in the Y-axis direction through the second contact holes CT2 formed in the interlayer insulating layer 114, the gate insulating layer 113, the buffer layer 112, and the plate patterns 111. Accordingly, as described above, the data pads 173 on the plurality of plate patterns 111 disposed in the Y-axis direction may be connected by a plurality of the second connection lines 182 serving as data lines, and one data signal may be transmitted thereto. In FIG. 2, the first connection line 181 and the second connection line 182 are illustrated as having a linear shape, but the present disclosure is not limited thereto.

In a general stretchable display device, a connection line is formed to extend from a top to a bottom by forming a contact hole in a bank and a planarization layer on a gate pad and a data pad. However, in this case, since the connection line is disposed to extend from a display element, that is, from a top portion of the bank to a lower substrate, a step in the connection line increases. Accordingly, there is a problem in that, the connection line which is formed to extend from the top to the bottom by forming the contact hole in the bank and the planarization layer on the gate pad and the data pad has a large step and thus, is easily damaged.

However, in the display device 100 according to an example embodiment of the present disclosure, the connection line 180 is disposed to extend from a partial area of the first lower pattern 110A of the lower substrate 110 to an area in which the second lower pattern 110B is disposed, and the contact hole CT is formed in the gate insulating layer 113, the buffer layer 112 and the plate pattern 111 under the gate pad 171 that is formed on the plate pattern 111, or the contact hole is formed in the interlayer insulating layer 114, the gate insulating layer 113, the buffer layer 112 and the plate pattern 111 under the data pad 173. Then, after filling the contact hole with the same material as the connection line 180, the connection line 180 and the gate pad 171 or the data pad 173 are formed to be electrically connected to each other, so that a step in the connection line 180 may be reduced, thereby minimizing damage to the connection line 180.

Referring to FIG. 3, the upper substrate 120 is a substrate supporting various components disposed under the upper substrate 120. The upper substrate 120 is a ductile substrate and may be formed of an insulating material that can be bent or stretched. The upper substrate 120 is a ductile substrate and may be reversibly expandable and contractible. Further, a modulus of elasticity of the upper substrate 120 may be several MPa to several hundreds of MPa, and a ductile breaking rate of the upper substrate 120 may be 100% or higher. A thickness of the upper substrate 120 may be 10 μm to 1 mm, but is not limited thereto.

The upper substrate 120 may be formed of the same material as the lower substrate 110, and for example, may be formed of silicone rubber such as polydimethylsiloxane (PDMS) or an elastomer such as polyurethane (PU) or the like, and thus, may have flexible properties. However, the material of the upper substrate 120 is not limited thereto.

Referring to FIG. 3, although the upper substrate 120 is illustrated as being formed of a single pattern, it may be formed to include a first upper pattern and a second upper pattern having different moduli like the lower substrate 110. For example, the first upper pattern of the upper substrate 120 may be disposed to correspond to the first lower pattern 110A of the lower substrate 120, and the second upper pattern of the upper substrate 120 may be disposed to correspond to the second lower pattern 110B of the lower substrate 120. In addition, the first upper pattern may be formed of a rigid material having a higher modulus than that of the second upper pattern, and the second upper pattern may be formed of a soft material having a lower modulus than that of the first upper pattern. Also, the second upper pattern may be disposed to surround the first upper pattern.

The upper substrate 120 and the lower substrate 110 may be bonded to each other by the upper adhesive layer 118 that is disposed under the upper substrate 120 by applying pressure to the upper substrate 120 and the lower substrate 110. However, the present disclosure is not limited thereto, and the upper adhesive layer 118 may be omitted depending on embodiments. For example, the display device 100 may be manufactured in a manner that the upper adhesive layer 118 is omitted and a material constituting the upper substrate 120 is coated and then cured.

The polarization layer 190 is disposed on the upper substrate 120. The polarization layer 190 may polarize light incident from the outside of the display device 100. Polarized light passing through the polarization layer 190 and incident onto an inside of the display device 100 may be reflected from the inside of the display device 100, and thus, a phase thereof may be shifted. The light of which the phase is shifted may not pass through the polarization layer 190. Accordingly, light that is incident onto the inside of the display device 100 from the outside of the display device 100 is not emitted back to the outside of the display device 100, so that external light reflection of the display device 100 may be reduced.

Meanwhile, in a conventional stretchable display device, various components on the plurality of plate patterns that are spaced apart from each other on the lower substrate may be electrically connected by the connection lines and pads. For example, connection lines are disposed on an upper surface of a bank, and the connection lines are connected to pads below the bank through contact holes that are formed in the bank and an insulating layer disposed under the bank. Also, the connection lines disposed on one plate pattern may extend from an edge of the one plate pattern toward an upper surface of the lower substrate and an upper surface of a bank of an adjacent plate pattern. In this case, the connection lines that extend from the upper surface of the lower substrate to the upper surface of the bank may have a large step between the upper surface of the bank and the upper surface of the lower substrate. For example, since the plate pattern may have a very large thickness of about 6 μm, the connection lines may have a large step at the edge of the plate pattern. In this case, a base polymer itself may be cut due to the step of the base polymer constituting the connection line, and thus, an electrical path between adjacent plate patterns may be blocked, so that a defect rate of a stretchable display device may increase.

Accordingly, in the display device 100 according to an example embodiment of the present disclosure, by forming the contact holes CT in the plate pattern 111 and the insulating layers 112, 113 and 114 that are disposed under the gate pad 171 and the data pad 173 and then, electrically connecting the connection lines 180 disposed on a lower surface of the plate pattern 111 to the gate pad 171 and the data pad 173 through the contact holes CT, so that the connection lines 180 may not have a step. Accordingly, reliability of the display device 100 may be improved by reducing damage to the connection lines 180 that is caused by the step of the connection lines 180.

Meanwhile, although it has been described that the pads connected by the connection lines 180 are the gate pad 171 and the data pad 173 in FIGS. 1 to 3, the present disclosure is not limited thereto.

Figure 4:
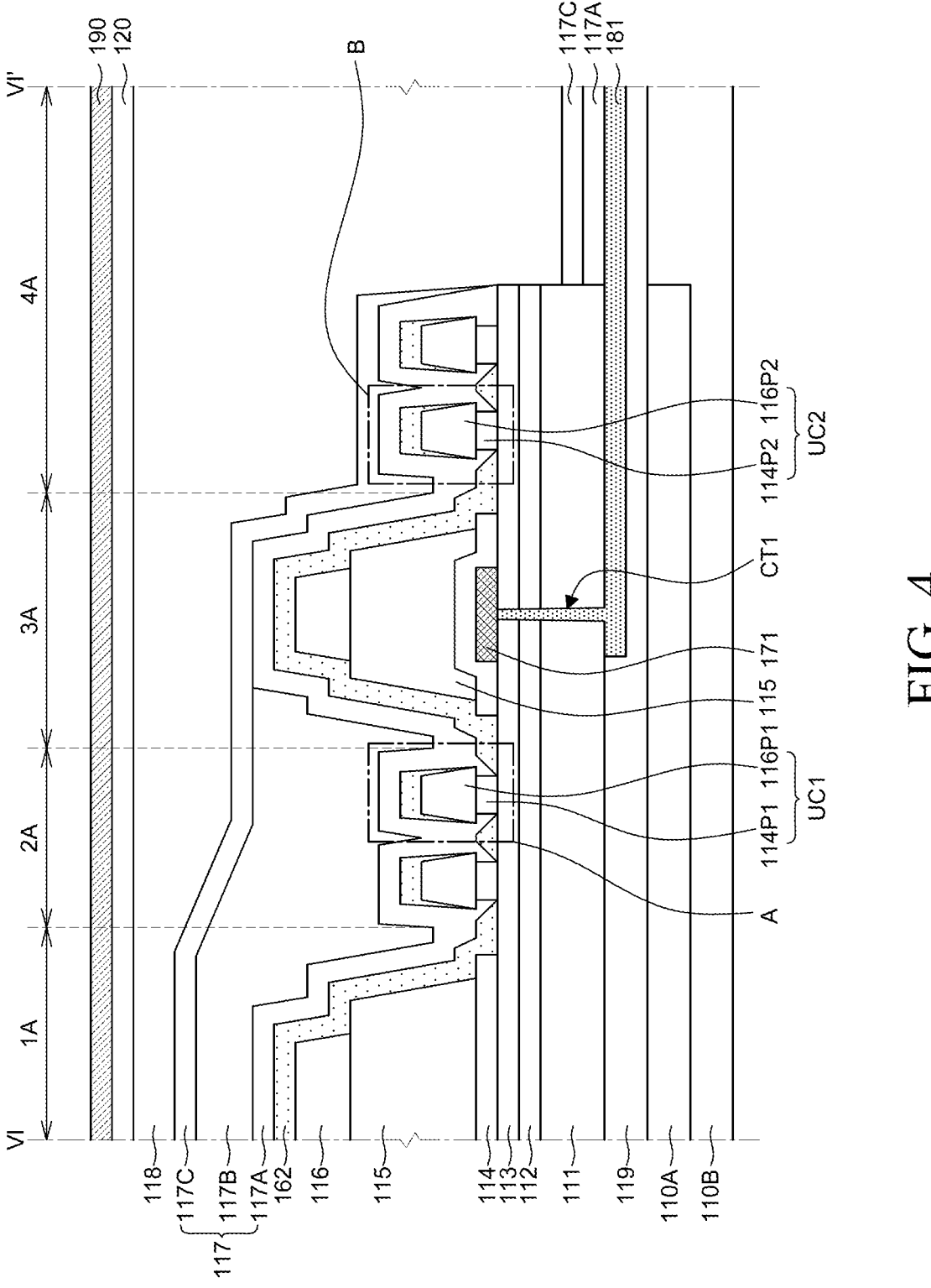
FIG. 4 is a cross-sectional view taken along VI-VI' of FIG. 2.
Figure 5:
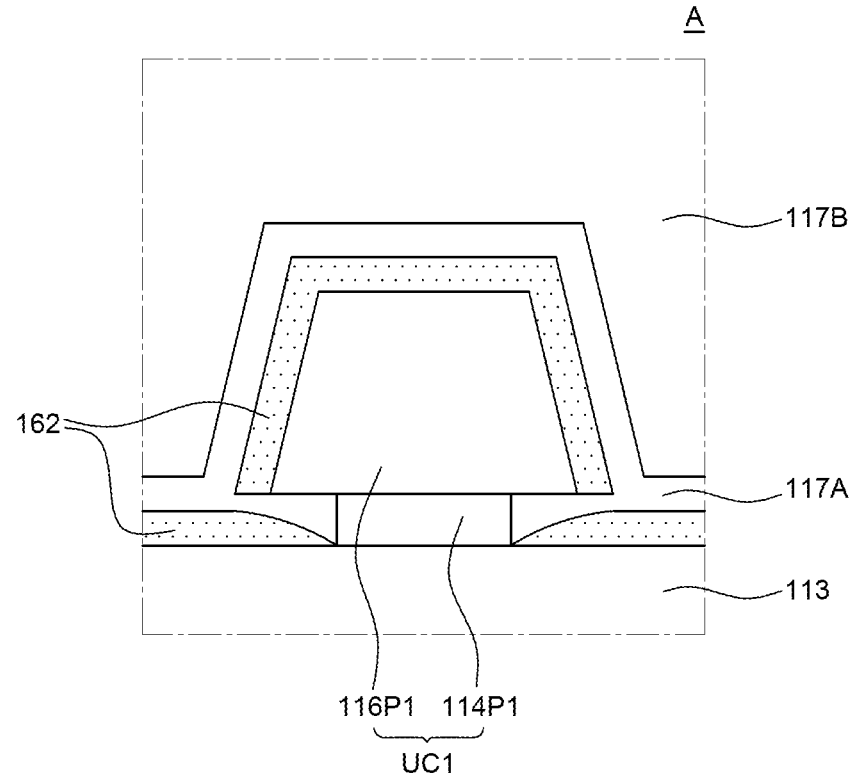
FIG. 5 is an enlarged view of area A of FIG. 4.
Figure 6:
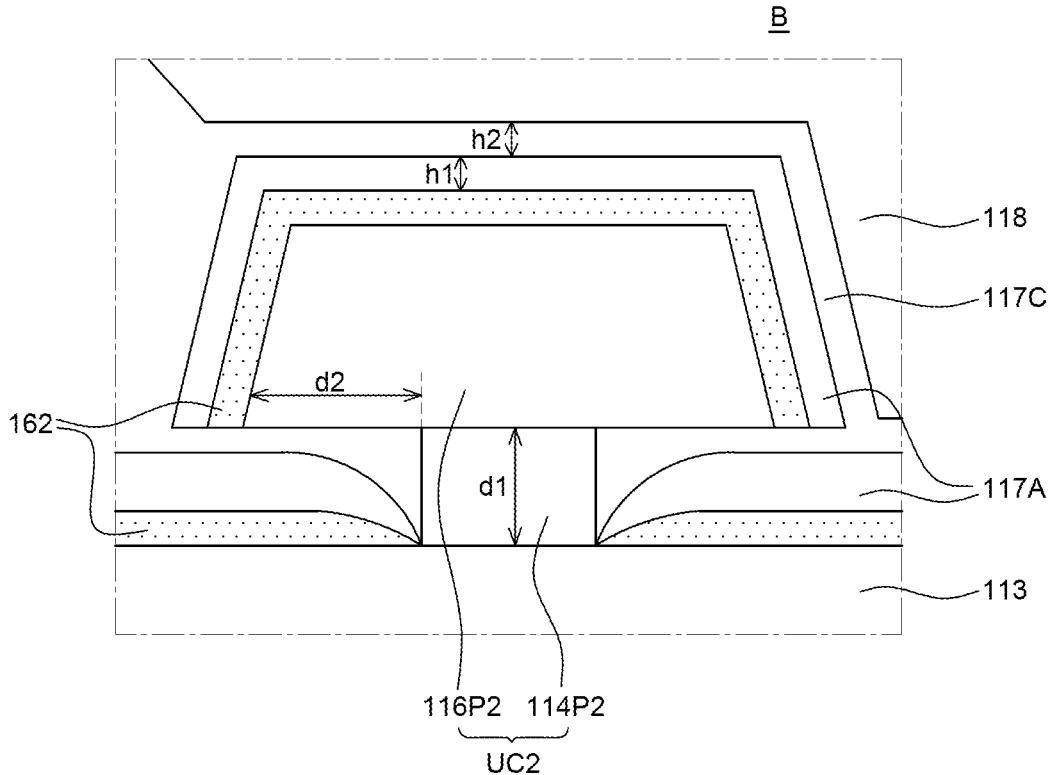
FIG. 6 is an enlarged view of area B of FIG. 4.

Hereinafter, FIG. 4 to FIG. 6 are referred to explain a structure in which the planarization layer 115, the bank 116, the organic light emitting layer 162, and the encapsulation unit 117 are disconnected by enlarging a portion of an outside of the anode 161 in FIG. 3. The encapsulation unit 117 may comprise an encapsulation structure. The encapsulation structure may include one or more encapsulation layers, such as the the first inorganic encapsulation layer 117A.

FIG. 4 is a cross-sectional view taken along VI-VI' of FIG. 2. FIG. 5 is an enlarged view of area A of FIG. 4. FIG. 6 is an enlarged view of area B of FIG. 4. Referring to FIG. 4, at least one of the planarization layer 115, the bank 116, the organic light emitting layer 162, and the encapsulation unit 117 is disconnected or patterned, so that a first area 1A, a second area 2A, a third area 3A and a fourth area 4A are divided.

Referring to FIG. 4, the first area 1A is an area including a plurality of sub-pixels SPX on one plate pattern 111, and is an area where a plurality of light emitting elements 160 are disposed on the planarization layer 115. The first area 1A illustrated in FIG. 4 is obtained by enlarging portions of the planarization layer 115, the organic light emitting layer 162, and the bank 116 disposed at the edge of the anode among areas in which the plurality of light emitting elements 160 are disposed.

The encapsulation unit 117 includes a first inorganic encapsulation layer 117A, an organic encapsulation layer 117B over the first inorganic encapsulation layer 117A, and a second inorganic encapsulation layer 117C over the organic encapsulation layer 117B. The encapsulation unit 117 is disposed on the cathode 163 to minimize deterioration of the light emitting element 160 due to moisture or oxygen. The encapsulation unit 117 may have a multilayer structure in which an inorganic layer formed of an inorganic insulating material and an organic layer formed of an organic material are stacked. For example, the encapsulation unit 117 may have a triple-layer structure including the first inorganic encapsulation layer 117A, the organic encapsulation layer 117B, and the second inorganic encapsulation layer 117C.

For example, each of the first inorganic encapsulation layer 117A and the second inorganic encapsulation layer 117C may be formed of at least one selected from silicon nitride ($SiN_x$), silicon oxide ($SiO_x$), or aluminum oxide ($Al_2O_3$), but is limited thereto. For example, the organic encapsulation layer 117B may be formed of at least one selected from an epoxy resin, polyimide, polyethylene, and silicon oxy carbon (SiOC), but is not limited thereto.

The first inorganic encapsulation layer 117A is disposed to be in contact with an upper surface and a side surface of the cathode 163. Also, the first inorganic encapsulation layer 117A may be disposed on an upper surface of the organic light emitting layer 162 on which the cathode 142 is not disposed.

In the first area 1A, the planarization layer 115 is disposed on the interlayer insulating layer 114, the bank 116 is disposed on the planarization layer 115, and the organic light emitting layer 162 is disposed over the bank 116. In addition, the organic light emitting layer 162 is also disposed on a side surface of the bank 116 and the planarization layer 115.

A first protrusion pattern UC1 having an undercut shape is disposed in the second area 2A that is adjacent to the first area 1A and surrounds the first area 1A. In the first protrusion pattern UC1, a pillar pattern 114P1 that is formed of the same material as and formed on the same layer as the interlayer insulating layer 114 and that has a pillar shape, and an eaves pattern 116P1 having an eaves shape over the pillar pattern 114P1 are disposed. A surface of the eaves pattern 116P1 in contact with the pillar pattern 114P1 may be wider than an upper surface of the pillar pattern 114P1. Since a lower surface of the eaves pattern 116P1 is wider than the upper surface of the pillar pattern 114P1, the first protrusion pattern UC1 may have an undercut shape. Although it is illustrated in FIG. 4 that two first protrusion patterns UC1 are disposed, only one first protrusion pattern UC1 or two or more first protrusion patterns UC1 may be disposed in the second area 2A. Referring to FIGS. 4 and 5 together, the eaves pattern 116P1 of the first protrusion pattern UC1 is formed of the same material as the bank 116. That is, the eaves pattern 116P1 of the first protrusion pattern UC1 may be formed by etching the bank 116 on the pillar pattern 114P1. However, this is only an example, and any material having a difference in selectivity with respect to an etchant of the pillar pattern 114P1 and the eaves pattern 116P1 may be used. Accordingly, although not illustrated in the drawings, the eaves pattern 116P may be formed of the same material as the bank 116 as well as the anode 161.

The organic light emitting layer 162 is disposed on the first protrusion pattern UC1, and the encapsulation unit 117 is disposed on the organic light emitting layer 162 in the second area 2A. The organic light emitting layer 162 and the encapsulation unit 117 may be disposed not only on an upper portion of the first protrusion pattern UC1 but also on a side portion of the first protrusion pattern UC1. In FIG. 4, the organic light emitting layer 162 is illustrated as being thinner on a side surface of the first protrusion pattern UC1 than on an upper surface of the first protrusion pattern UC1, but is not limited thereto.

Meanwhile, the organic light emitting layer 162 is disconnected in the second area 2A. The organic light emitting layer 162 may be disconnected due to a high step of the first protrusion pattern UC1. In the first area 1A, the organic light emitting layer 162 may be disposed on inclined side surfaces of the interlayer insulating layer 114, the planarization layer 115 and the bank 116, and an upper portion of the interlayer insulating layer 114 from an upper portion of the bank 116 to the interlayer insulating layer 114. However, a step is formed in the organic light emitting layer 162 at an edge of the first protrusion pattern UC1, so that the organic light emitting layer 162 may be disconnected in an area adjacent to the first protrusion pattern UC1.

Referring to FIG. 5, the organic light emitting layer 162 disposed on the gate insulating layer 113 has a shape in which it is broken and is not connected to the organic light emitting layer 162 disposed on a side surface of the eaves pattern 116P1. The first inorganic encapsulation layer 117A may fill a space defined by the eaves pattern 116P1, the pillar pattern 114P1, and the broken organic light emitting layer 162. As illustrated in FIG. 5, the organic light emitting layer 162 may be in contact with an edge of the pillar pattern 114P1, but a portion where the organic light emitting layer 162 is disconnected is not contact with the pillar pattern 114P1 and the first inorganic encapsulation layer 117A may be disposed between the pillar pattern 114P1 and the organic light emitting layer 162. Accordingly, the first inorganic encapsulation layer 117A may be in contact with the upper surface of the organic light emitting layer 162 and a portion of a side surface of the pillar pattern 114P1 and the lower surface of the eaves pattern 116P1, and in some cases, may be in contact with a portion of an upper surface of the gate insulating layer 113.

Referring to FIG. 4, in the third area 3A, the planarization layer 115 is disposed on the interlayer insulating layer 114 and the bank 116 is disposed on the planarization layer 115. Specifically, the gate pad 171 may be disposed in the third area 3A, the interlayer insulating layer 114 may be disposed on the gate pad 171, the planarization layer 115 may be disposed on the interlayer insulating layer 114 in an area smaller than the interlayer insulating layer 114, the bank 116 may be disposed on the planarization layer 115 in an area smaller than the planarization layer 115, and the organic light emitting layer 162 may be disposed on the side surface and the upper surface of the planarization layer 115 and the bank 116. Also, in the third area 3A, the connection line 180 may be disposed below the gate pad 171, and the first contact hole CT1 may be disposed so that the gate pad 171 and the connection line 180 are electrically connected to each other.

In the third area 3A, in the encapsulation unit 117, the first inorganic encapsulation layer 117A, the organic encapsulation layer 117B, and the second inorganic encapsulation layer 117C may be sequentially disposed, but the organic encapsulation layer 117B may be disposed only in an area adjacent to the second area 2A, the organic encapsulation layer 117B may not be disposed in an area adjacent to the fourth area 4A. In the third area 3A, the second inorganic encapsulation layer 117C may be disposed on the first inorganic encapsulation layer 117A in the area adjacent to the fourth area 4A. This is because a sum of thicknesses of the planarization layer 115 and the bank 116 disposed in the third area 3A is greater than a height of each of the first protrusion pattern UC1 and a second protrusion pattern UC2. In other words, the organic encapsulation layer 117B has a greater thickness than the first inorganic encapsulation layer 117A and the second inorganic encapsulation layer 117C, but since the sum of thicknesses of the planarization layer 115 and the bank 116 disposed in the third area 3A has a greater value than the thickness of the organic encapsulation layer 117B, the organic encapsulation layer 117B may not be disposed on the bank 116 in the third area 3A.

Referring to FIGS. 4 and 6 together, the second protrusion pattern UC2 having an undercut shape is disposed in the fourth area 4A surrounding the third area 3A. In the second protrusion pattern UC2, a pillar pattern 114P2 that is formed of the same material as and formed on the same layer as the interlayer insulating layer 114 and that has a pillar shape, and an eaves pattern 116P2 having an eaves shape over the pillar pattern 114P2 are disposed. A surface of the eaves pattern 116P2 in contact with the pillar pattern 114P2 may be wider than an upper surface of the pillar pattern 114P2. Since a lower surface of the eaves pattern 116P2 is wider than the upper surface of the pillar pattern 114P2, the second protrusion pattern UC2 may have an undercut shape. Although it is illustrated that two second protrusion patterns UC2 are disposed in FIG. 4, only one second protrusion pattern UC2 or two or more second protrusion patterns UC2 may be disposed in the fourth area 4A.

Similar to the first protrusion pattern UC1, the eaves pattern 116P2 of the second protrusion pattern UC2 may be formed of the same material as the bank 116, but is not limited thereto. For example, the eaves pattern 116P2 may be formed of the same material as the bank 116 as well as the anode 161.

The organic light emitting layer 162 is disposed on the second protrusion pattern UC2, and the encapsulation unit 117 is disposed on the organic light emitting layer 162 in the fourth area 4A. The organic light emitting layer 162 and the encapsulation unit 117 may be disposed not only on an upper portion of the second protrusion pattern UC2 but also on a side portion of the second protrusion pattern UC2. In FIG. 4, the organic light emitting layer 162 is illustrated as being thinner on a side surface of the second protrusion pattern UC2 than on an upper surface of the second protrusion pattern UC2, but is not limited thereto.

Meanwhile, the organic light emitting layer 162 is disconnected in the fourth area 4A. The organic light emitting layer 162 may be disconnected due to a high step of the second protrusion pattern UC2. In the third area 3A, the organic light emitting layer 162 may be disposed on inclined side surfaces of the interlayer insulating layer 114, the planarization layer 115 and the bank 116, and an upper portion of the interlayer insulating layer 114 from an upper portion of the bank 116 to the interlayer insulating layer 114. However, a step is formed in the organic light emitting layer 162 at an edge of the second protrusion pattern UC2, so that the organic light emitting layer 162 may be disconnected in an area adjacent to the second protrusion pattern UC2.

Referring to FIG. 6, the encapsulation unit 117 is disconnected in the fourth area 4A. When a half d2 of a width of a surface that is not in contact with the pillar pattern 114P2 in the lower surface of the eaves pattern 116P2 of the second protrusion pattern UC2 is greater than a height d1 of the pillar pattern 114P2, and a thickness of the pillar pattern 114P2 is greater than a sum of a thickness of the first inorganic encapsulation layer 117A and a thickness of the second inorganic encapsulation layer 117C, the first inorganic encapsulation layer 117A may be disconnected in an area adjacent to the second protrusion pattern UC2. This is because a high step is formed in the first inorganic encapsulation layer 117A between the upper surface of the organic light emitting layer 162 and the upper surface of the second protrusion pattern UC2. Specifically, a value of the half d2 of the width of the surface that is not in contact with the pillar pattern 114P2 in the lower surface of the eaves pattern 116P2 may have a value that is about 5 times or more of the height d1 of the pillar pattern 114P2 of the second protrusion pattern UC2.

As illustrated in FIG. 6, the organic light emitting layer 162 and the first inorganic encapsulation layer 117A may be in contact with an edge of the pillar pattern 114P2, but a portion where the organic light emitting layer 162 and the first inorganic encapsulation layer 117A are disconnected is not contact with the pillar pattern 114P2. The second inorganic encapsulation layer 117C may be disposed between the pillar pattern 114P2 and the first inorganic encapsulation layer 117A. Accordingly, the second inorganic encapsulation layer 117C may be in contact with a portion of an upper surface of the first inorganic encapsulation layer 117A, a side surface of the pillar pattern 114P2, and the lower surface of the eaves pattern 116P2, and in some cases, may be in contact with a portion of the upper surface of the gate insulating layer 113.

The first inorganic encapsulation layer 117A and the second inorganic encapsulation layer 117C are disconnected at a boundary between the plate pattern 111 and the connection line 180 in the fourth area 4A. The first inorganic encapsulation layer 117A is disposed on the plurality of connection lines 180, and the second inorganic encapsulation layer 117C is disposed on the first inorganic encapsulation layer 117A. In this case, an upper surface of the second inorganic encapsulation layer 117C disposed on the plurality of connection lines 180 may be lower than a lower surface of the first inorganic encapsulation layer 117A disposed on the plurality of plate patterns 111. Accordingly, the first inorganic encapsulation layer 117A and the second inorganic encapsulation layer 117C disposed on the connection lines 180 may be in contact with a side surface of the plate pattern 111.

Accordingly, in the display device 100 according to an example embodiment of the present disclosure, the organic light emitting layer 162 may be disconnected by disposing the first protrusion patterns UC1 in the second area 2A and the fourth area 4A. Therefore, even when cracks occur in the organic light emitting layer 162, propagation thereof can be prevented. Even if the organic light emitting layer 162 is deposited on an entire surface of each of the plurality of plate patterns 111, the organic light emitting layer 162 is disconnected in the second area 2A and the fourth area 4A of the plate pattern 111, so propagation of cracks to an area where the plurality of sub-pixels SPX are disposed can be suppressed. In addition, even if foreign matter permeates or moisture and oxygen permeate to an edge of the organic light emitting layer 162, effects thereof may be minimized.

In the display device 100 according to an example embodiment of the present disclosure, even if the encapsulation unit 117 is deposited and formed on the entire surface of the lower substrate 110, propagation of cracks to the encapsulation unit 117 adjacent to the light emitting element due to stretching of the lower substrate 110 can be minimized. When the encapsulation unit 117 is deposited on the entire surface, the possibility of generating cracks when the lower substrate 110 is stretched is high. However, since the first inorganic encapsulation layer 117A and the second inorganic encapsulation layer 117C are disconnected by disposing the second protrusion pattern UC2 on the plate pattern 111 in the fourth area 4A and disposing the connection line 180 between the plate pattern 111 and the lower substrate 110, the first inorganic encapsulation layer 117A and the second inorganic encapsulation layer 117C are disconnected, so that it is possible to suppress propagation of cracks to the area where the plurality of sub-pixels SPX are disposed. Accordingly, it is possible to deposit the inorganic encapsulation layers 117A and 117C on the entire surface of the lower substrate 110 without individually depositing the inorganic encapsulation layers 117A and 117C on each of the plate patterns 111. In addition, by forming a step in the inorganic encapsulation layers 117A and 117C at an edge of the plate pattern 111, it is possible to effectively suppress moisture and oxygen permeation to side surfaces of the plurality of sub-pixels SPX.

The example embodiments of the present disclosure can also be described as follows:

According to an aspect of the present disclosure, there is provided a display device. The display device includes a stretchable lower substrate, a pattern layer disposed on the lower substrate and including a plurality of plate patterns and a plurality of line patterns, a plurality of connection lines disposed on each of the plurality of line patterns to connect the plurality of plate patterns adjacent to each other, an insulating layer disposed on each of the plurality of plate patterns, a plurality of light emitting elements disposed on the insulating layer and each including an anode, an organic light emitting layer and a cathode, a bank disposed on edge of the anode, and an encapsulation unit disposed on the bank and the cathode. Each of the plurality of plate patterns includes a first area in which the plurality of light emitting elements are disposed, a second area which surrounds the first area and in which a first protrusion pattern having an undercut shape is disposed, a third area surrounding the second area, and a fourth area which surrounds the third area and in which a second protrusion pattern having an undercut shape is disposed.

The display device may further include a planarization layer disposed on the insulating layer in the first area. The plurality of light emitting elements may be disposed on the planarization layer.

The organic light emitting layer may be disconnected in the second area and the fourth area.

The encapsulation unit may include a first inorganic encapsulation layer, an organic encapsulation layer over the first inorganic encapsulation layer, and a second inorganic encapsulation layer over the organic encapsulation layer. In the fourth area, the encapsulation unit may be disconnected.

The first protrusion pattern and the second protrusion pattern may include a pillar pattern which is formed of the same material as the insulating layer and an eaves pattern which is disposed on the pillar pattern, a surface of the eaves pattern in contact with the pillar pattern being wider than an upper surface of the pillar pattern. The organic light emitting layer may be disconnected by the first protrusion pattern and the second protrusion pattern.

The eaves pattern may be formed of the same material as the bank.

The eaves pattern may be formed of the same material as the anode.

A thickness of the pillar pattern of the second protrusion pattern may be less than half of a width of a lower surface of the eaves pattern, which is not in contact with the pillar pattern.

A thickness of the pillar pattern of the second protrusion pattern may be greater than a sum of thicknesses of the first inorganic encapsulation layer and the second inorganic encapsulation layer.

In the fourth area, the first inorganic encapsulation layer may be disposed on the plurality of connection lines and the second inorganic encapsulation layer may be disposed on the first inorganic encapsulation layer.

An upper surface of the second inorganic encapsulation layer disposed on the plurality of connection lines may be lower than a lower surface of the first inorganic encapsulation layer disposed on the plurality of plate patterns.

The display device may further include a planarization layer disposed between the insulating layer and the bank in the third area. A sum of thicknesses of the planarization layer and the bank may be greater than heights of the first protrusion pattern and the second protrusion pattern.

A height of the second protrusion pattern may be higher than a height of the first protrusion pattern.

The plurality of connection lines may be disposed between the plurality of plate patterns and the lower substrate, and electrically connect pads disposed on adjacent plate patterns among the plurality of plate patterns.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a stretchable lower substrate;

a plurality of plate patterns disposed on the stretchable lower substrate;

a plurality of connection lines disposed on the stretchable lower substrate to connect the plurality of plate patterns adjacent to each other;

an insulating layer disposed on each of the plurality of plate patterns;

a plurality of light emitting elements disposed on the insulating layer and each including an anode, an organic light emitting layer and a cathode;

a bank disposed on an edge of the anode; and an encapsulation structure disposed on the bank and the cathode, wherein each of the plurality of plate patterns includes, a first area in which the plurality of light emitting elements are disposed, a second area which is adjacent to the first area and in which a first protrusion pattern having an undercut shape is disposed, a third area adjacent to the second area, and a fourth area which is adjacent to the third area and in which a second protrusion pattern having an undercut shape is disposed.

2. The display device of claim 1, further comprising: a planarization layer disposed on the insulating layer in the first area, wherein the plurality of light emitting elements are disposed on the planarization layer.

3. The display device of claim 1, wherein the organic light emitting layer is disconnected in the second area and the fourth area.

4. The display device of claim 1, wherein the encapsulation structure includes a first inorganic encapsulation layer, an organic encapsulation layer over the first inorganic encapsulation layer, and a second inorganic encapsulation layer over the organic encapsulation layer, wherein in the fourth area, the encapsulation structure is disconnected.

5. The display device of claim 4, wherein the first protrusion pattern and the second protrusion pattern include a pillar pattern which is formed of the same material as the insulating layer and an eaves pattern which is disposed on the pillar pattern, a surface of the eaves pattern in contact with the pillar pattern being wider than an upper surface of the pillar pattern, wherein the organic light emitting layer is disconnected by the first protrusion pattern and the second protrusion pattern.

6. The display device of claim 5, wherein the eaves pattern is formed of the same material as the bank.

7. The display device of claim 5, wherein the eaves pattern is formed of the same material as the anode.

8. The display device of claim 5, wherein a thickness of the pillar pattern of the second protrusion pattern is less than half of a width of a lower surface of the eaves pattern, which is not in contact with the pillar pattern.

9. The display device of claim 5, wherein a thickness of the pillar pattern of the second protrusion pattern is greater than a sum of thicknesses of the first inorganic encapsulation layer and the second inorganic encapsulation layer.

10. The display device of claim 4, wherein in the fourth area, the first inorganic encapsulation layer is disposed on the plurality of connection lines and the second inorganic encapsulation layer is disposed on the first inorganic encapsulation layer.

11. The display device of claim 10, wherein an upper surface of the second inorganic encapsulation layer disposed on the plurality of connection lines is lower than a lower surface of the first inorganic encapsulation layer disposed on the plurality of plate patterns.

12. The display device of claim 1, further comprising: a planarization layer disposed between the insulating layer and the bank in the third area, wherein a sum of thicknesses of the planarization layer and the bank is greater than heights of the first protrusion pattern and the second protrusion pattern.

13. The display device of claim 1, wherein a height of the second protrusion pattern is higher than a height of the first protrusion pattern.

14. The display device of claim 1, wherein the plurality of connection lines are disposed between the plurality of plate patterns and the stretchable lower substrate, and electrically connect pads disposed on adjacent plate patterns among the plurality of plate patterns.

* * * * *